(12) United States Patent
Ohguro (10) Patent No.: US 7,479,726 B2
(45) Date of Patent: Jan. 20, 2009

(54) MEMS DEVICE USING AN ACTUATOR

(75) Inventor: Tatsuya Ohguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 11/696,939

(22) Filed: Apr. 5, 2007

(65) Prior Publication Data

US 2007/0241636 A1 Oct. 18, 2007

(30) Foreign Application Priority Data

Apr. 6, 2006 (JP) ............................. 2006-105737

(51) Int. Cl.
*H01L 41/08* (2006.01)
(52) U.S. Cl. ........................ 310/330; 310/311; 310/309
(58) Field of Classification Search ................. 310/306, 310/309, 330, 332
See application file for complete search history.

(56) References Cited

U.S. PATENT DOCUMENTS 6,242,989 B1 6/2001 Barber et al.
6,307,452 B1 10/2001 Sun
6,700,299 B2 3/2004 Quenzer et al.
6,781,285 B1 * 8/2004 Lazarus et al. .............. 310/332
7,145,284 B2 12/2006 Ikehashi

\* cited by examiner

*Primary Examiner*—Mark Budd
(74) *Attorney, Agent, or Firm*—Oblon, Spivak, McClelland, Maier & Neustadt, P.C.

(57) ABSTRACT

A MEMS includes an actuator, first and second electrodes, and a fixed shaft. The actuator is provided above a substrate. The actuator has one end and the other end. The one end of the actuator is coupled relative to the substrate. The first electrode is arranged at a position facing the second electrode. The second electrode has one end and the other end. The one end of the second electrode is coupled to the other end of the actuator. The other end of the second electrode is a free end. The fixed shaft is connected to the second electrode between the one end thereof and the other end thereof. The first electrode faces the second electrode at a portion between the fixed shaft and the other end of the second electrode.

20 Claims, 5 Drawing Sheets

MEMS DEVICE USING AN ACTUATOR

CROSS-REFERENCE TO RELATED APPLICATIONS

This application is based upon and claims the benefit of priority from prior Japanese Patent Application No. 2006-105737, filed Apr. 6, 2006, the entire contents of which are incorporated herein by reference.

BACKGROUND OF THE INVENTION

1. Field of the Invention

The present invention relates to a MEMS (Micro electro Mechanical system) device using an actuator.

2. Description of the Related Art

Conventionally, a MEMS variable capacitor using an actuator has top and bottom electrodes. The top or bottom electrode is vertically varied by the actuator, and thereby, functions as a variable capacitor. For example, the bottom electrode is arranged on a substrate while the top electrode is attached to the actuator, and the top electrode is vertically varied. The MEMS variable capacitor having the foregoing structure has the following problem. The top electrode attached to the actuator is bent due to residual stress of a film itself forming the top electrode. In this case, the top electrode is bent to a direction (hereinafter, referred to as upward) opposite to the bottom electrode, or to the bottom electrode direction (hereinafter, referred to as downward). For this reason, in the initial state that the actuator is not driven, the top electrode is set to an unsuitable position, and the position of the top electrode is displaced.

BRIEF SUMMARY OF THE INVENTION

According to a first aspect of the present invention, there is provided a Micro-electro-mechanical system (MEMS) comprising:

an actuator provided above a substrate, and having a movable part; and a first electrode formed on the substrate; and a second electrode coupled to the movable part of the actuator, and configured to be displaced by the actuator, the second electrode being arranged at a position facing the first electrode, and having a fixed shaft between the movable part of the actuator and the first electrode, the fixed shaft being coupled relative to the substrate.

A portion in the vicinity of the fixed shaft in the second electrode between the movable part and the fixed shaft displaces in a first direction, and a portion in the vicinity of the fixed shaft in the second electrode on the side of the first electrode from the fixed shaft displaces in a second direction opposite to the first direction.

According to a second aspect of the present invention, there is provided a Micro-electro-mechanical system (MEMS) comprising:

an actuator provided above a substrate, the actuator having one end and the other end, the one end of the actuator being coupled relative to the substrate;

first and second electrodes, the first electrode being arranged at a position facing the second electrode, the second electrode having one end and the other end, the one end of the second electrode being coupled to the other end of the actuator, the other end of the second electrode being a free potion; and a fixed shaft connected to the second electrode between the one end thereof and the other end thereof. The first electrode faces the second electrode at a portion between the fixed shaft and the other end of the second electrode.

DETAILED DESCRIPTION OF THE INVENTION

Various embodiments of the present invention will be hereinafter described with reference to the accompanying drawings. In MEMS using actuator according to each embodiment, a variable capacitor using a piezoelectric actuator is explained giving as an example.

Embodiment 1

Figure 1:
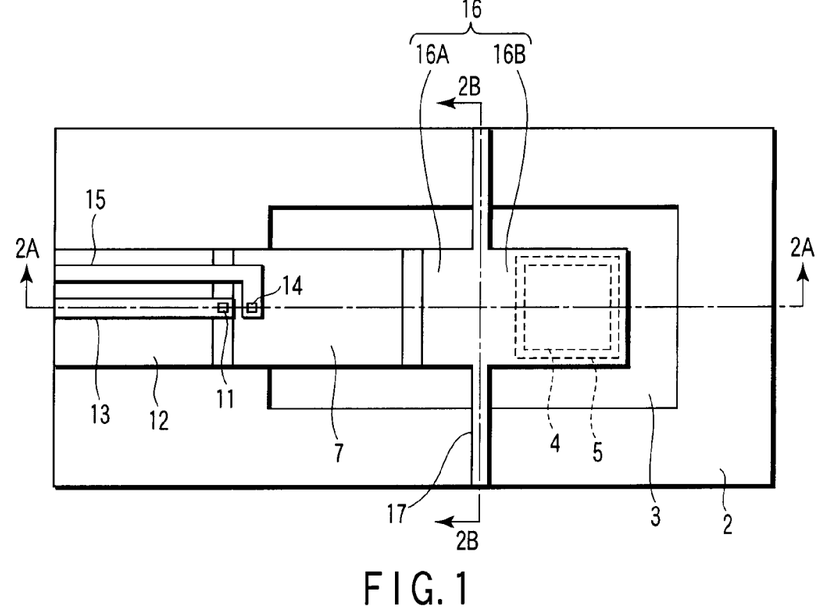
FIG. 1 is a top plan view showing the structure of a variable capacitor using a piezoelectric actuator according to a first embodiment of the present invention.
Figure 2A:
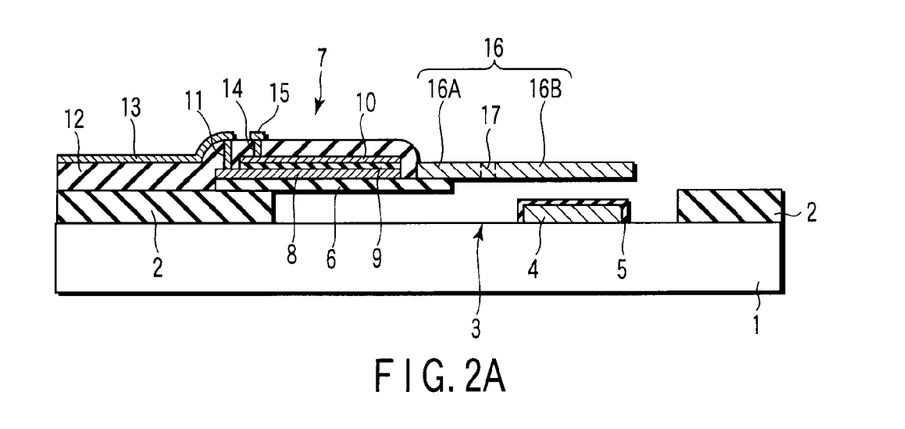
FIG. 2A and FIG. 2B are cross-sectional views showing the structure of the variable capacitor shown in FIG. 1.
Figure 2B:
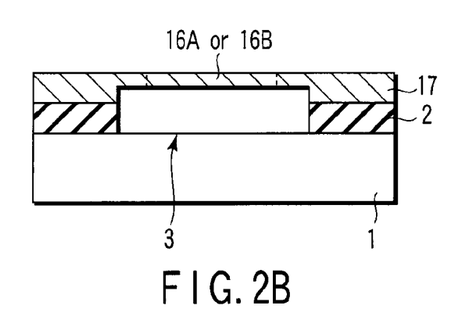

FIG. 1 is a top plan view showing the structure of a variable capacitor using a piezoelectric actuator according to a first embodiment of the present invention. FIG. 2A is a cross-sectional view taken along the line 2A-2A of the variable capacitor of the embodiment 1 shown in FIG. 1. FIG. 2B is a cross-sectional view taken along the line 2B-2B of the variable capacitor.

As shown in FIGS. 1, 2A and 2B, an insulating layer 2 is formed on a semiconductor substrate 1. For example, the following semiconductors are usable as the semiconductor substrate 1. One is intrinsic semiconductors such as Si and Ge, and another is compound semiconductors such as GaAs and ZnSe. Another is high conductive semiconductors doping impurity to these semiconductors. Moreover, a SOI (Silicon On Insulator) substrate or glass substrate is usable in place of the semiconductor substrate. The insulating layer 2 consists of a silicon oxide film ($SiO_2$).

The insulating layer 2 is partially formed with a trench 3. The semiconductor substrate 1 in the trench 3 is formed with a bottom electrode 4 of a variable capacitor. The surface of the bottom electrode 4 is covered with an insulating layer 5 comprising silicon nitride film (SiN). The insulating layer 5 has a function as a dielectric material between a top electrode 16 and the bottom electrode 4 of the variable capacitor. In this case, Al, Cu and W are given as the material for forming the bottom electrode 4.

An insulating layer 6 is formed on the insulating layer 2 and the trench 3. Specifically, one end of the insulating layer 6 is formed on the insulating layer 2, and the other end thereof is formed to project onto the trench 3 from the upper surface of the insulating layer 2. As the insulating material used for the insulating layer 6, a material simply movable in associated with the movement of a piezoelectric actuator 7 is suitable. For example, $Si_3N_4$, $SiO_2$, AlN, $Ta_2O_5$ and $Al_2O_3$ are given. The insulating layer 6 may be a single layer insulating material, and a stacked structure combining the foregoing materials may be employed.

A piezoelectric actuator 7 is provided on the insulating layer 6. The piezoelectric actuator 7 is configured in a manner that bottom electrode 8, piezoelectric layer 9 and top electrode 10 are successively stacked on the insulating layer 6. In this case, the bottom electrode 8 is formed to have an area lager than the piezoelectric layer 9 and the top electrode 10. The bottom electrode 8 has an area lager than the piezoelectric layer 9 and the top electrode 10, and thereby, the following advantage is obtained. Namely, it is easy to form a contact plug 11 connected to the bottom electrode 8. Incidentally, the foregoing bottom electrode 8, piezoelectric layer 9 and top electrode 10 may have the same area. Conversely, the piezoelectric layer 9 and the top electrode 10 may have an area lager than the bottom electrode 8.

The piezoelectric layer 9 may have an area lager or smaller than the bottom electrode 8 and the top electrode 10, like the foregoing bottom electrode 8. Moreover, the piezoelectric layer 9 may have the same area as above. The piezoelectric layer 9 has often a rectangular shape in its plane. The piezoelectric layer 9 may be formed into various shapes, for example, square, polygon and meander shapes.

The following materials are given as the material for bottom and top electrodes 8 and 10 of the piezoelectric actuator 7. For example, Au or alloy mixing Co and Ni with Au, or material containing any one of Pt, Sr, Ru, Cr, Mo, W, Ti, Al, Cu and Ni are given. Nitride containing any one of the foregoing materials, conductive oxide or compound consisting of the foregoing material is given. Or, materials stacking materials selected from the foregoing materials, nitride, conductive oxide and compound are given.

For example, piezoelectric materials such as PZT ($Pb(Zr, Ti)O_3$), AlN, ZnO, PbTiO, BTO ($BaTiO_3$) and polymer piezoelectric material such as PVDF (polyvinylidene fluoride) are given as the material of the piezoelectric layer 9.

An insulating layer 12 is formed to cover the piezoelectric actuator 7 on the piezoelectric actuator 7 and the insulating layer 2. In this case, $SiO_2$ is given as the material for the insulating layer 12. The end portion of the bottom electrode 8 of the piezoelectric actuator 7 is formed with a contact plug 11, which penetrates through the insulating layer 12. The contact plug 11 is connected to a contact layer 13 formed on the insulating layer 12. By doing so, voltage is applied to the bottom electrode 8 from the contact layer 13. Moreover, the top electrode 10 of the piezoelectric actuator 7 is formed with a contact plug 14. The contact plug 14 is connected to a contact layer 15 formed on the insulating layer 12. By doing so, voltage is applied to the top electrode 10 from the contact layer 15. In this case, Al, Cu and W are given as the material for contact plugs 11, 14 and contact layers 13, 15.

A top electrode 16 of the variable capacitor is formed to project above the bottom electrode 4 from the insulating layer 6. A fixed shaft 17 is provided in a direction orthogonal to the longitudinal direction of the top electrode 16. The fixed shaft 17 is connected to the top electrode 16, or integrally formed with the top electrode 16 using the same material as the electrode 16. The fixed shaft 17 is interposed between the bottom electrode 4 of the variable capacitor and the piezoelectric actuator 7. As illustrated in FIG. 2B, the top electrode 16 is formed over the semiconductor substrate 1 via cavity. The fixed shaft 17 above the trench is arranged over the semiconductor substrate 1 via cavity. The fixed shaft 17 on the insulating layer 2 is fixed to the insulating layer 2. The fixed shaft 17 connected to the top electrode 16 is connected to a contact (not shown) suppied with potential for operating the top electrode 16 as the variable capacitor. In this case, any of Si, Au, Cu and Al or alloy mixing Co and Ni with Au are given as the material used for the top electrode 16 of the variable capacitor and the fixed shaft 17. In the following description, the top electrode 16 is divided into first and second parts 16A and 16B. The first part 16A is positioned between the piezoelectric actuator 7 and the fixed shaft 17. The second part 16B is position on the side of the bottom electrode 4 from the fixed shaft 17.

Figure 2C:
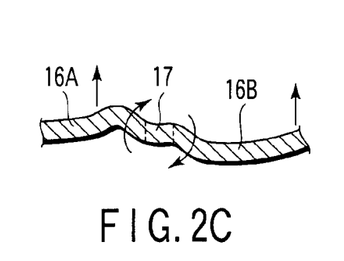
FIG. 2C is a enlarged cross-sectional view showing the vicinity of a fixed shaft in FIG. 2A.

The MEMS variable capacitor having the foregoing structure has the following features in the initial state that the piezoelectric actuator 7 is not driven. Specifically, the first part 16A of the top electrode 16 between the actuator 7 and the fixed shaft 17 and the second part 16B thereof on the side of the bottom electrode 4 from the fixed shaft 17 are upwardly or downwardly bent. This bend is generated due to the residual stress of the top electrode 16 itself. Here, as shown in FIG. 2C, the first and second parts 16A and 16B are upwardly bent. At the time, the first part 16A of the top electrode 16 is coupled to one end of the actuator 7, and the other end of the actuator 7 is coupled to the insulating layer 2 formed on the semiconductor substrate 1. Thus, the first part 16A is not displaced with a high degree of freedom. On the other hand, the tip end of the second part 16B of the top electrode 16 is a free end. With this structure, if the first part 16A is upwardly bent, this upward bending movement allows the portion in the vicinity of the fixed shaft 17 in the second part 16B to be displaced downward. This downward displacement of the second part 16B serves to reduce the upward displacement of the second part 16B. This serves to arrange the second part 16B of the top electrode 16 to a desired position.

For example, if no fixed shaft 17 is given, the top electrode 16 comprising the first and second parts 16A and 16B is upwardly bent due to the residual stress in the initial state. For this reason, the top electrode 16 is upwardly and largely displaced; as a result, the top electrode 16 is shifted from a desired position.

According to this embodiment, the fixed shaft 17 is interposed (formed) between the first and second parts 16A and 16B. In such a case, the first and second parts 16A and 16B are upwardly bent due to residual stress. The first part 16A is upwardly bent, and thereby, the portion in the vicinity of the fixed shaft 17 in the first part 16A is upwardly displaced. That portion in the vicinity of the fixed shaft 17 in the second part 16B is exerted with a force causing upward displacement. Unlike the first part 16A, the second part 16B is free at the other end. Therefore, when the first part 16A is displaced upward, the second part 16B is easily applied with a force that rotates itself downward around the fixed shaft 17. Eventually, the portion in the vicinity of the fixed shaft 17 in the second part 16B is displaced downward. As described above, the second part 16B is upwardly bent by residual stress. However, the downward displacement of the vicinity portion of the fixed shaft 17 serves to reduce upward displacement of the second part 16B. By doing so, the second part 16B of the top electrode 16 facing the bottom electrode 4 is arranged to a desired position.

In order to vary the capacitance of the MEMS variable capacitor, the top electrode 16 is closed to the bottom electrode 4. In order to perform this, the piezoelectric actuator 7 is upwardly driven, and thereby, the first part 16A of the top electrode 16 is upwardly displaced. The rotation of the top electrode 16 around the fixed shaft 17 permits the second part 16B to be displaced downward from the initial-state position. Therefore, the capacitance of the variable capacitor is variable. In this embodiment, the top electrode 16 is upwardly bent (to a direction opposite to substrate) by residual stress. This embodiment is applicable to the case where the top electrode 16 is downwardly bent (to a substrate direction) by residual stress.

Figure 3A:
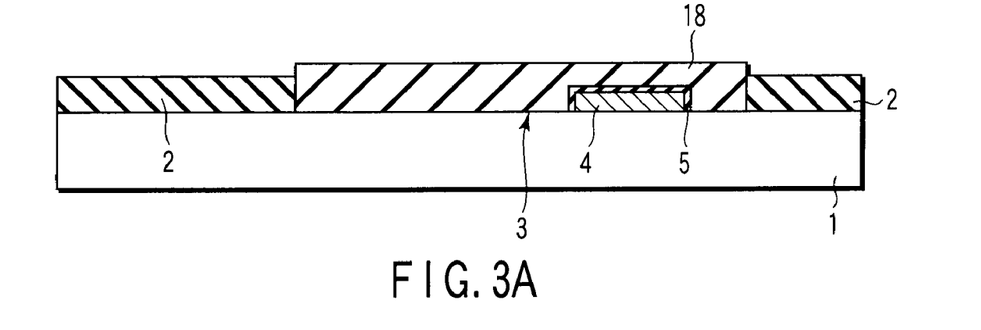
FIG. 3A to FIG. 3C is a cross-sectional view to explain a method of manufacturing the variable capacitor using the piezoelectric actuator according to the first embodiment.
Figure 3B:
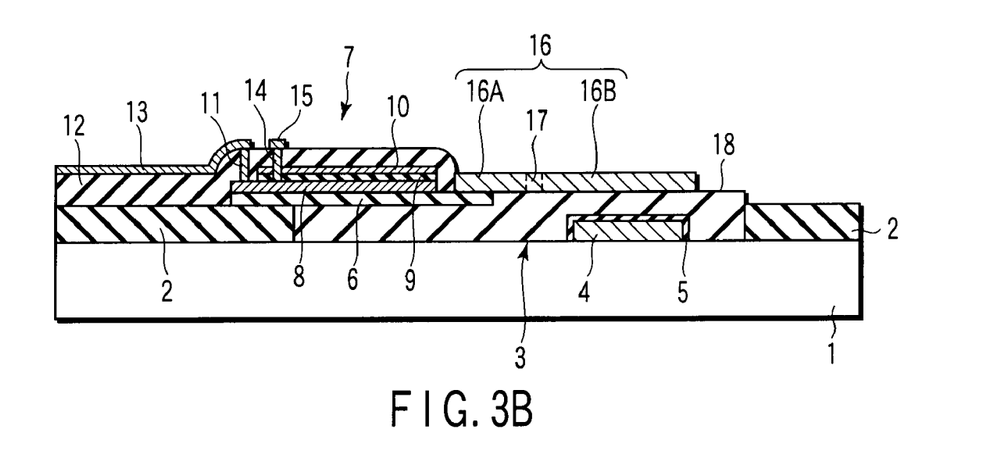
Figure 3C:
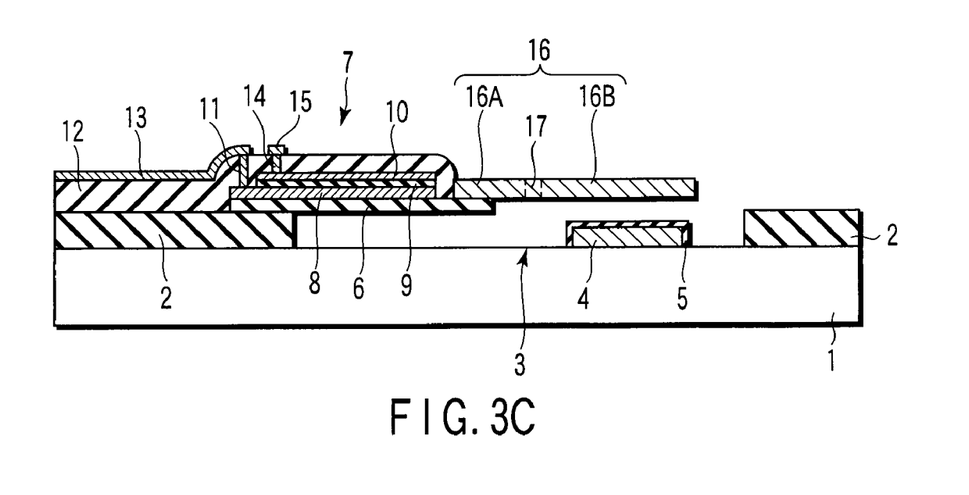

The variable capacitor using the piezoelectric actuator according to the first embodiment is manufactured via the following process. FIG. 3A to FIG. 3C is a cross-sectional view to explain a method of manufacturing the variable capacitor according to the first embodiment.

As shown in FIG. 3A, an insulating layer 2 is formed on a semiconductor substrate 1 using CVD (Chemical Vapor Deposition) process. Part of the insulating layer 2 is formed with a trench 3 using lithography and RIE (Reactive Ion Etching). Then, a bottom electrode 4 of the variable capacitor is formed on the semiconductor substrate 1 in the trench 3. Thereafter, an insulating layer 5 is formed to cover the bottom electrode 4. A polysilicon film (sacrificial film) 18 is buried in the trench 3 formed in part of the insulating layer 2 using CVD process.

As depicted in FIG. 3B, the piezoelectric actuator 7 having the foregoing structure and a top electrode 16 of the variable capacitor are formed on the insulating layer 2 and the polysilicon film 18. In this case, the top electrode 16 of the variable capacitor 16 is formed, and simultaneously, a fixed shaft 17 is formed according to the known patterning technique. The fixed shaft 17 is connected to the top electrode 16, and integrally formed with the top electrode 16 using the same material.

An insulating layer 12 is formed on the piezoelectric actuator 7 and the insulating layer 2. Then, contact plugs 11 and 14 connected to top and bottom electrodes 10 and 8 of the piezoelectric actuator 7 and contact layers 13 and 15 are formed. A contact (not shown) connected to the top electrode 16 of the variable capacitor and the bottom electrode 4 is further formed.

As seen from FIG. 3C, the polysilicon film (sacrificial film) 18 buried in the trench 3 is removed using CDE (Chemical Dry Etching) using fluorine gas, for example XeF$_2$. When the polysilicon film (sacrificial film) 18 is removed, the fixed shaft 17 is formed between the first and second parts 16A and 16B of the top electrode 16. By doing so, the top electrode 16 is prevented from being upwardly bent by residual stress. Nevertheless, the first and second parts 16A and 16B are upwardly bent by residual stress. However, when the first part 16A is upwardly bent, the portion in the vicinity of the fixed shaft 17 in the second part 16B is downwardly displaced. This downward displacement of the second part 16B serves to reduce the upward displacement of the second part 16B. As a result, the second part 16B of the top electrode 16 is arranged to a desired position. Via the foregoing process, the variable capacitor using the piezoelectric actuator according to the first embodiment of the present invention is manufactured.

Voltage is applied to the top and bottom electrodes 10 and 8 of the actuator 7. For example, ground potential 0 V is applied to the bottom electrode 8 while voltage of 3 V is applied to the top electrode 10. In this case, a piezoelectric layer 9 of the actuator 7 is shrunken in the horizontal direction. The actuator 7 is moved to the upward direction or the downward direction. In this case, the actuator 7 is configured to move to the upward direction.

The actuator 7 is upwardly displaced, and thereby, the first part 16A of the top electrode 16 coupled to a movable part of the actuator 7 is upwardly displaced. In this embodiment, the top electrode 16 is provided with the fixed shaft 17. Thus, the first part 16A on the actuator 7 from the fixed shaft 17 is upwardly displaced. As a result, the second part 16B on the side of the bottom electrode 4 from the fixed shaft 17 is downwardly displaced (to a direction of the bottom electrode 4). This makes small the distance between the top electrode 16 of the variable capacitor and the bottom electrode 4; therefore, the capacitance of the variable capacitor becomes large. When the top electrode 16 contacts with the insulating layer 5 on the bottom electrode 4; the capacitance of the variable capacitor becomes the maximum. As described above, the upward displacement of the actuator 7 is controlled, and thereby, the capacitance of the variable capacitor is variable.

In the variable capacitor using the piezoelectric actuator according to the first embodiment, the top electrode 16 of the variable capacitor is provided with the fixed shaft 17. By doing so, in the initial state that the actuator 7 is not driven, even if the top electrode 16 coupled to the actuator 7 is upwardly or downwardly bent by residual stress, the top electrode 16 is arranged to a desired position.

Embodiment 2

Figure 4:
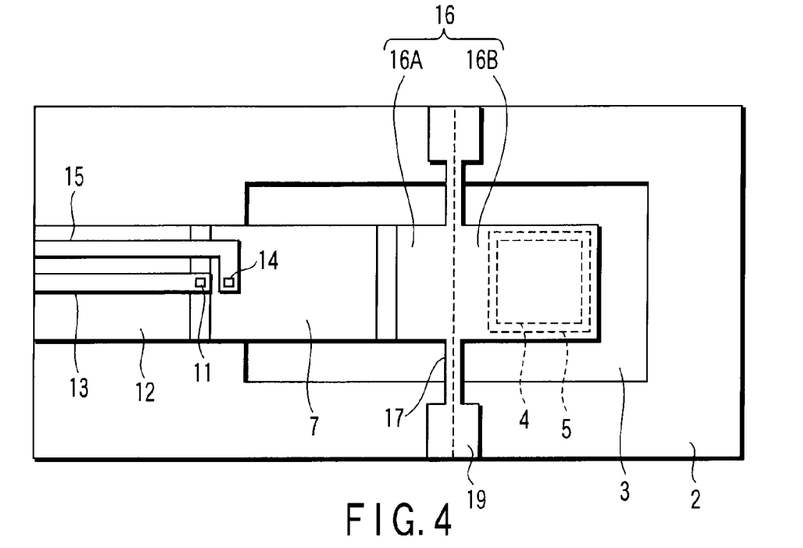
FIG. 4 is a top plan view showing the structure of a variable capacitor using a piezoelectric actuator according to a second embodiment of the present invention.

FIG. 4 is a top plan view showing the structure of a variable capacitor using a piezoelectric actuator according to a second embodiment of the present invention.

The difference will be hereinafter described between the first and second embodiments. According to the first embodiment, the thin and long fixed shaft 17 is provided in a direction orthogonal to the longitudinal direction of the top electrode 16 of the variable capacitor. According to the second embodiment, as seen from FIG. 4, part of the fixed shaft 17 is formed with a wide area 19 in order to improve the strength for fixing the top electrode 16 by the fixed shaft 17. The same reference numerals are used to designate other components identical to the first embodiment, and therefore, the explanation is omitted.

The variable capacitor having the foregoing structure is manufactured in the following manner. Specifically, in the manufacturing process shown in the first embodiment, patterning is carried out so that part of the fixed shaft 17 is formed with a wide area 19 when the top electrode 16 and the fixed shaft 17 are formed. Other portions of the variable capacitor are manufactured according the same process as the first embodiment, and therefore, the explanation is omitted. The operation of the variable capacitor using piezoelectric actuator according to the second embodiment is the same as the first embodiment, and therefore, the explanation is also omitted.

In the variable capacitor using piezoelectric actuator according to the second embodiment, the top electrode 16 of the variable capacitor is provided with the fixed shaft 17. By doing so, in the initial state that the actuator 7 is not driven, even if the top electrode 16 coupled to the actuator 7 is bent to any of upward or downward direction, the top electrode 16 is arranged at a desired position.

Part of the thin fixed shaft 17 comprising a thin material is formed with a wide width area 19. By doing so, the strength of the fixed shaft 17 for fixing the top electrode 16 is enhanced. Thus, this serves to prevent variations of arrangement position of the top electrode 16 in the initial state of the variable capacitor. As a result, the position of the top electrode 16 is stabilized in the initial state.

In order to further improve the strength of the fixed shaft 17 connected to the top electrode 16 of the variable capacitor, the fixed shaft 17 is formed thick in it's the film thickness. Moreover, the width of the fixed shaft 17 is made large to improve the strength. In addition, another metal material may be deposited on the fixed shaft 17 to improve the strength. As another metal material, the same material as used for the top electrode 16 of the variable capacitor and the bottom electrode 4 is used.

Embodiment 3

Figure 5:
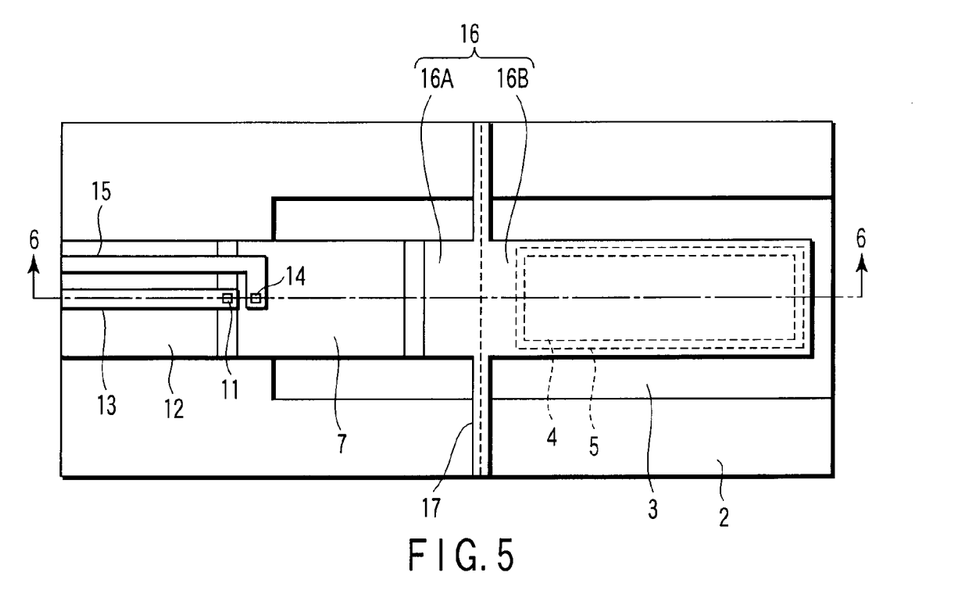
FIG. 5 is a top plan view showing the structure of a variable capacitor using a piezoelectric actuator according to a third embodiment of the present invention.
Figure 6:
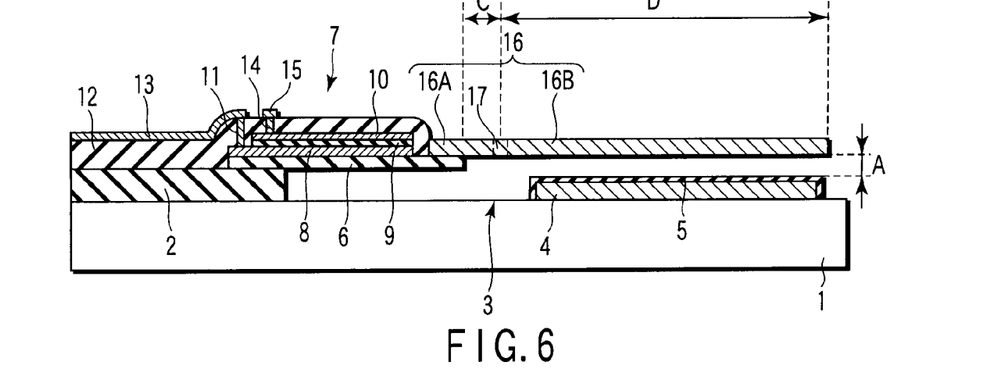
FIG. 6 is a cross-sectional view taken along the line 6-6 of the variable capacitor shown in FIG. 5.

FIG. 5 is a top plan view showing the structure of a variable capacitor using a piezoelectric actuator according to a third embodiment of the present invention. FIG. 6 is a cross-sectional view taken along the line 6-6 of the variable capacitor shown in FIG. 5.

The difference between the third embodiment and the first embodiment is as follows. As seen from FIG. 5 and FIG. 6, the longitudinal distance (length) of the top electrode 16 becomes largely long as compared with the length of the top electrode 16 in the first embodiment. The same reference numerals are used to designate other components identical to the first embodiment, and therefore, the explanation is omitted.

For example, when the actuator 7 is not operated, the distance between the end of the top electrode 16 and the insulating layer 5 is set as A. On the other hand, when the actuator 7 is operated, the displacement of the end of the insulating layer 6 under the actuator 7 is set as B. In this case, the distance between the end of the insulating layer forming the actuator 7 and the fixed shaft 17 is set as C. The distance D between the fixed shaft 17 and the end of the top electrode 16 is set so that a relationship of D×B/C>A is established. Specifically, the distance A between the end of the top electrode 16 and the insulating layer 5 is 2 μm. The actuator 7 is operated, and thereby, if the end of the insulating layer 6 under the actuator 7 has the displacement of 1 μm, the distance C and D are set as follows. The distance C between the fixed shaft 17 and the end of the insulating layer 6 under the actuator 7 is set to 1 μm. The distance D between the fixed shaft 17 and the end of the top electrode 16 is set to 3 μm.

The variable capacitor using the piezoelectric actuator 7 having the foregoing structure has the following features. When the insulating layer 2 is formed with a trench 3, the trench 3 is widely formed in the longitudinal direction so that the top electrode 16 of variable capacitor is longitudinally formed long. When the top electrode 16 and the fixed shaft 17 are formed, patterning is carried out so that the top electrode 16 becomes largely long in the longitudinal direction. By doing so, the variable capacitor using the piezoelectric actuator 7 of the third embodiment is formed. The process of manufacturing other portions of the variable capacitor is the same as the first embodiment, and therefore, the explanation is omitted. The operation of the variable capacitor using the piezoelectric actuator 7 of the third embodiment is the same as the first embodiment, and therefore, the explanation is omitted.

In the variable capacitor using the piezoelectric actuator 7 of the third embodiment, the top electrode 16 of the variable capacitor is provided with the fixed shaft 17. By doing so, in the initial state that the actuator 7 is not driven, even if the top electrode 16 coupled to the actuator 7 is bent to any of upward or downward direction, the top electrode 16 is arranged at a desired position.

The position of the fixed shaft 17 connected to the top electrode 16 is adjust, and thereby, small displacement of the actuator 7 serves to largely displace the top electrode 16. Therefore, the top electrode 16 of the variable capacitor is formed long in the longitudinal direction as compared with the first embodiment. By doing so, small displacement of the actuator 7 serves to largely displace the top electrode 16.

Embodiment 4

Figure 7:
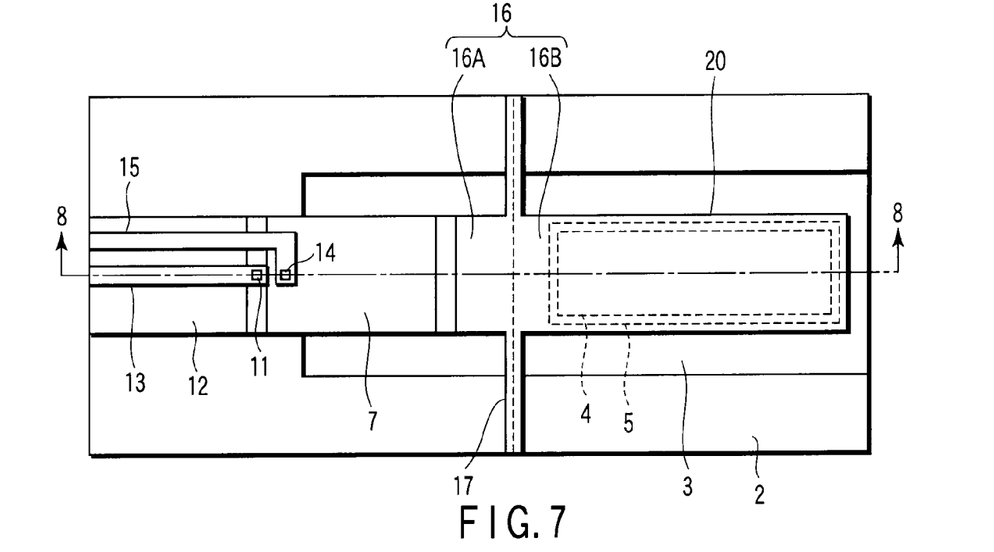
FIG. 7 is a top plan view showing the structure of a variable capacitor using a piezoelectric actuator according to a fourth embodiment of the present invention.
Figure 8:
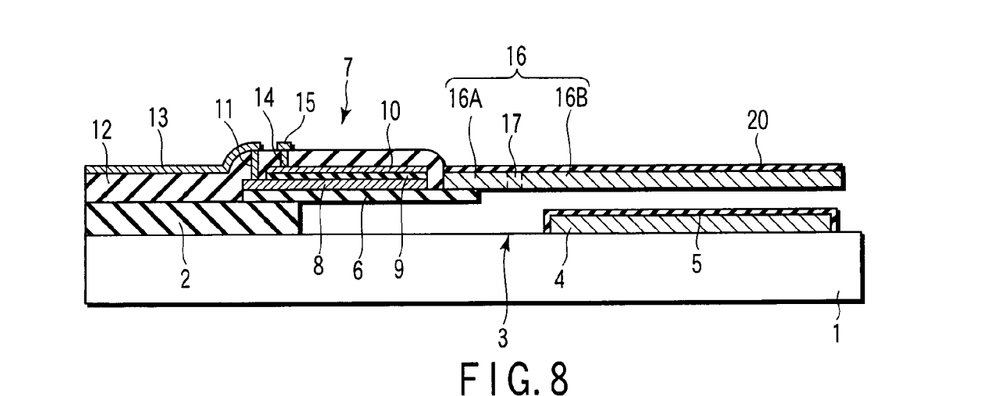
FIG. 8 is a cross-sectional view taken along the line 8-8 of the variable capacitor shown in FIG. 7.

FIG. 7 is a top plan view showing the structure of a variable capacitor using a piezoelectric actuator according to a fourth embodiment of the present invention. FIG. 8 is a cross-sectional view taken along the line 8-8 of the variable capacitor shown in FIG. 7.

The difference between the fourth embodiment and the third embodiment is as follows. According to the fourth embodiment, the top electrode 16 is formed with a film 20 having tensile stress, as seen from FIG. 7 and FIG. 8. As the film 20 having tensile stress, SiN, TiN, Pt, Ti, PZT and $SrTiO_3$ are given. The same reference numerals are used to designate portions having the same configuration as the third embodiment, and the explanation is omitted.

In the variable capacitor of the fourth embodiment, when the top electrode 16 and the fixed shaft 17 are formed, a metal film used for the material of the top electrode 16 and the fixed shaft 17 is formed. Thereafter, a film 20 having tensile tress is formed on the metal film. Patterning of the top electrode 16 and the fixed shaft 17 are carried out with respect to the metal film and the film 20 having tensile stress. By doing so, the variable capacitor having the structure that the film 20 having tensile stress is attacked on the top electrode 16 is formed. The process of manufacturing other portions of the variable capacitor is the same as the first embodiment, and therefore, the explanation is omitted. The operation of the variable capacitor using the piezoelectric actuator 7 of the third embodiment is the same as the first embodiment, and therefore, the explanation is omitted.

In the variable capacitor of the fourth embodiment, the film 20 having tensile stress is formed on the top electrode 16 of the variable capacitor. By doing so, it is possible to prevent the top electrode 16 projecting from the insulating layer 6 from hanging down. Moreover, the top electrode 16 of the variable capacitor is provided with the fixed shaft 17. By doing so, in the initial state that the actuator 7 is not driven, even if the top electrode 16 coupled to the actuator 7 is bent to any of upward or downward direction by residual stress, the top electrode 16 is arranged at a desired position.

According to the fourth embodiment, the top electrode 16 of the variable capacitor is form long in the longitudinal direction. This embodiment is applicable to the case where the top electrode 16 is not formed long in the longitudinal direction.

Embodiment 5

Figure 9:
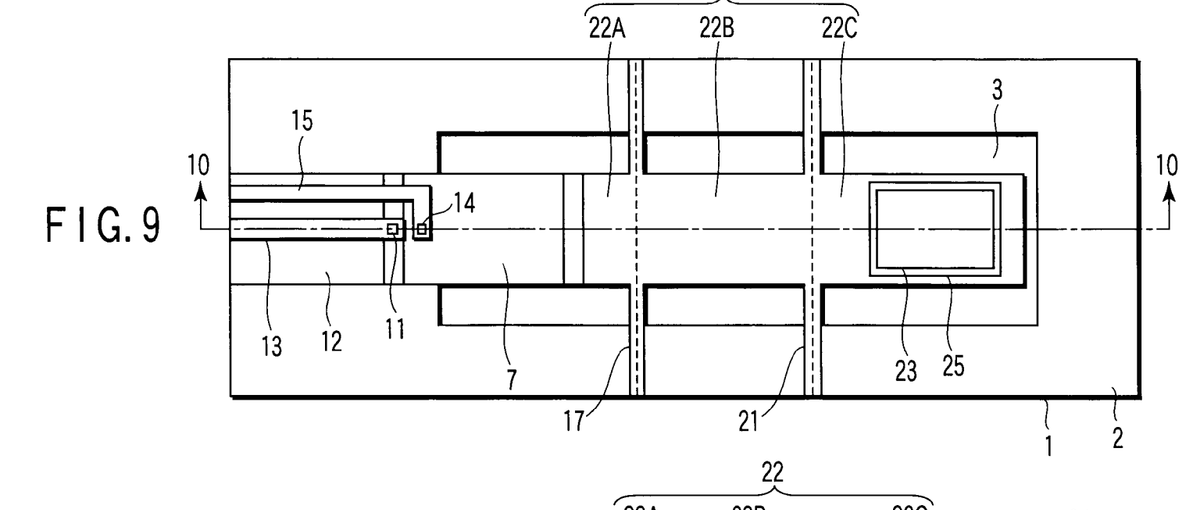
FIG. 9 is a top plan view showing the structure of a variable capacitor using a piezoelectric actuator according to a fifth embodiment of the present invention.
Figure 10:
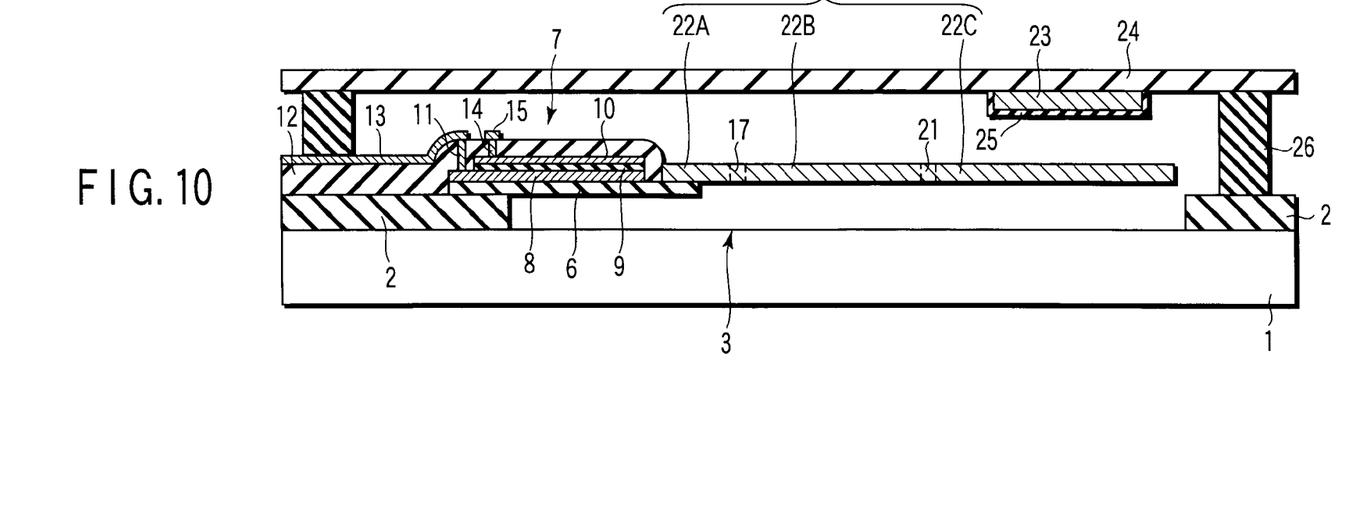
FIG. 10 is a cross-sectional view taken along the line 10-10 of the variable capacitor shown in FIG. 9.

FIG. 9 is a top plan view showing the structure of a variable capacitor using a piezoelectric actuator according to a fifth embodiment of the present invention. FIG. 10 is a cross-sectional view taken along the line 10-10 of the variable capacitor shown in FIG. 9.

The difference between the fifth embodiment and the foregoing each embodiment will be described hereinafter. According to the foregoing each embodiment, one portion of the top electrode 16 is provided with the fixed shaft 17. According to the fifth embodiment, a bottom electrode 22 is provided with two fixed shafts 17 and 21, as seen from FIG. 9 and FIG. 10.

In the variable capacitor of the fifth embodiment, no bottom electrode 4 is formed on a semiconductor substrate 1 in a trench 3. An electrode coupled to the actuator 7 functions as a bottom electrode 22. A top electrode 23 is formed above the bottom electrode 22. The top electrode 23 is formed at the lower portion of an insulating layer 24. An insulating layer 25 is formed to cover the top electrode 23. The insulating layer 24 is supported by an insulating layer 26 formed on the insulating layers 12 and 2 so that cavity is formed between the bottom electrode 22 and the top electrode 23.

In the MEMS variable capacitor having the foregoing structure, the following features are given in the initial state that the actuator 7 is not driven. The bottom electrode 22 is composed of first part 22A between the actuator 7 and the fixed shaft 17, second part 22B between the fixed shaft 17 and the fixed shaft 21 and third part 22C on the side of the top electrode 23 from the fixed shaft 21. The bottom electrode 22 itself is upwardly bent by residual stress. When the first part 22A is upwardly bent, a portion in the vicinity of the fixed shaft 17 in the second part 22B downwardly displaces. This downward displacement of the second part 22B serves to reduce upward displacement of the second part 22B. When the second part 22B upwardly displaces, a portion in the vicinity of the fixed shaft 21 in the third part 22C downwardly displaces. This downward displacement of the third part 22C serves to reduce upward displacement of the third part 22C. As a result, the third part 22c of the bottom electrode 22 is arranged at a desired position.

The variable capacitor of the fifth embodiment is operated in the following manner.

Voltage is applied to top and bottom electrodes 10 and 8 of the actuator 7. For example, when ground potential of 0 V is applied to the bottom electrode 8 while voltage of 3 V is applied to the top electrode 10, the piezoelectric layer 9 of the actuator 7 is shrunk in the horizontal direction. This facilitates upward or downward movement of the actuator 7. Here, the actuator 7 is configured to upwardly move.

The actuator 7 is upwardly displaced, and thereby, the first part 22A of the bottom electrode 22 coupled to the movable part of the actuator 7 upwardly displaces. By this upward displacement, the second part 22B of the bottom electrode 22 downwardly displaces. By downward displacement, the third part 22C of the bottom electrode 22 upwardly displaces. Via the foregoing displacement, the distance between the bottom and top electrodes 22 and 23 is made narrow; therefore, the capacitance of the variable capacitor is made large. When the bottom electrode 22 contacts with the insulating layer 25 on the top electrode 23; the capacitance of the variable capacitor becomes the maximum. As described above, upward displacement of the actuator 7 is controlled, and thereby, the capacitance of the variable capacitor is variable.

In the variable capacitor using the piezoelectric actuator 7 according to the fifth embodiment, the bottom electrode 22 of the variable capacitor is provide with two fixed shafts 17 and 21. By doing so, in the initial state that the actuator 7 is not driven, even if the bottom electrode 22 attached to the actuator 7 is bent to any of upward or downward direction by residual stress, the bottom electrode 22 is arranged at a desired position. Incidentally, the electrode of the variable capacitor is provided with two fixed shafts 17, 21; in this case, the fixed shaft may be provided three or more.

In the variable capacitor using the piezoelectric actuator according to the embodiments of the present invention, the electrode coupled to the actuator is provided with the fixed shaft. By doing so, it is possible to provide MEMS having the following configuration. Specifically, in the initial state that the actuator is not driven, even if the electrode coupled to the actuator is bent to any of upward or downward direction by residual stress, the electrode is arranged at a desired position.

The present invention is not limited to the foregoing embodiments, and various modifications may be carried out without departing from the scope of the subject matter of the present invention. For example, the variable capacitor is configured using the piezoelectric actuator in the foregoing embodiments. In this case, other actuators, for example, electrostatic, thermal and magnetic actuators are applicable to the foregoing embodiments. Moreover, in the foregoing each embodiment, the variable capacitor using MEMS technique is described as one example. Dielectric materials between electrodes are removed, and thereby, the variable capacitor is usable as a switch.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A Micro-electro-mechanical system (MEMS) comprising:
    an actuator provided above a substrate, and having a movable part; and
    a first electrode formed on the substrate; and
    a second electrode coupled to the movable part of the actuator, and configured to be displaced by the actuator, the second electrode being arranged at a position facing the first electrode, and having a fixed shaft between the movable part of the actuator and the first electrode, the fixed shaft being coupled relative to the substrate,
    wherein a portion in the vicinity of the fixed shaft in the second electrode between the movable part and the fixed shaft displaces in a first direction, and a portion in the vicinity of the fixed shaft in the second electrode on the side of the first electrode from the fixed shaft displaces in a second direction opposite to the first direction.

2. The MEMS according to claim 1, further comprising an insulating layer formed on the substrate,
    wherein the fixed shaft is arranged in a direction orthogonal to the longitudinal direction of the second electrode, and fixed to the insulating layer.

3. The MEMS according to claim 1, wherein the fixed shaft is integrally formed using the same material as the second electrode.

4. The MEMS according to claim 3, wherein the second electrode is supplied with a potential via the fixed shaft.

5. The MEMS according to claim 1, wherein the movable part of the actuator moves to the first direction, and thereby, the second electrode between the movable part and the fixed shaft displaces in the first direction, and the second electrode on the side of the first electrode from the fixed shaft displaces in the second direction.

6. The MEMS according to claim 2, wherein one end of the fixed shaft is connected to the second electrode while the other end thereof is fixed to the insulating layer, and said other end of the fixed shaft has a width larger than said one end thereof.

7. The MEMS according to claim 1, wherein the second electrode on the side of the first electrode from the fixed shaft is formed longer than the second electrode between the movable part of the actuator and the fixed shaft.

8. The MEMS according to claim 1, further comprising a film having tensile stress, formed on the second electrode.

9. The MEMS according to claim 1, wherein the actuator includes one of piezoelectric and electrostatic actuator.

10. The MEMS according to claim 1, wherein the second electrode coupled to the movable part of the actuator is formed of at least one of Si, Au, Cu, and Al and an alloy obtained by mixing Co and/or Ni with Au.

11. A Micro-electro-mechanical system (MEMS) comprising:
- an actuator provided above a substrate, the actuator having one end and the other end, said one end of the actuator being coupled relative to the substrate;
- first and second electrodes, the first electrode being arranged at a position facing the second electrode, the second electrode having one end and the other end, said one end of the second electrode being coupled to said other end of the actuator, said other end of the second electrode being a free end; and
- a fixed shaft connected to the second electrode between said one end thereof and said other end thereof, wherein the first electrode faces the second electrode at a portion between the fixed shaft and said other end of the second electrode.

12. The MEMS according to claim 11, further comprising an insulating layer formed on the substrate,
- wherein the actuator is coupled to the insulating layer, the first electrode is formed on the substrate, and the fixed shaft is arranged in a direction orthogonal to the longitudinal direction of the second electrode and connected to the insulating layer.

13. The MEMS according to claim 11, wherein the fixed shaft is integrally formed using the same material as the second electrode.

14. The MEMS according to claim 13, wherein the second electrode is supplied with a potential via the fixed shaft.

15. The MEMS according to claim 11, wherein the actuator moves to a first direction, and thereby, the second electrode between the actuator and the fixed shaft displaces in the first direction, and the second electrode on the side of the first electrode from the fixed shaft displaces in a second direction opposite to the first direction.

16. The MEMS according to claim 12, wherein one end of the fixed shaft is connected to the second electrode while the other end thereof is fixed to the insulating layer, and said other end of the fixed shaft has a width larger than said one end thereof.

17. The MEMS according to claim 11, wherein the second electrode on the side of the first electrode from the fixed shaft is formed longer than the second electrode between the actuator and the fixed shaft.

18. The MEMS according to claim 11, further comprising a film having tensile stress, formed on the second electrode.

19. The MEMS according to claim 11, wherein the actuator includes one of piezoelectric and electrostatic actuator.

20. The MEMS according to claim 11, wherein the second electrode whose one end is coupled to the other end of the actuator is formed of at least one of Si, Au, Cu, and Al and an alloy obtained by mixing Co and/or Ni with Au.

* * * * *